US007506293B2

(12) United States Patent
Dasdan et al.

(10) Patent No.: US 7,506,293 B2
(45) Date of Patent: Mar. 17, 2009

(54) CHARACTERIZING SEQUENTIAL CELLS USING INTERDEPENDENT SETUP AND HOLD TIMES, AND UTILIZING THE SEQUENTIAL CELL CHARACTERIZATIONS IN STATIC TIMING ANALYSIS

(75) Inventors: Ali Dasdan, San Jose, CA (US); Emre Salman, Istanbul (TR); Feroze P. Taraporevala, San Jose, CA (US); Kayhan Kucukcakar, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 416 days.

(21) Appl. No.: 11/387,224

(22) Filed: Mar. 22, 2006

(65) Prior Publication Data

US 2007/0226668 A1    Sep. 27, 2007

(51) Int. Cl.
 *G06F 17/50* (2006.01)
(52) U.S. Cl. ............... 716/6; 716/4; 716/5; 703/14; 703/19
(58) Field of Classification Search .......... 716/4–6; 703/14, 19
 See application file for complete search history.

(56) References Cited

U.S. PATENT DOCUMENTS

| | | | | |
|---|---|---|---|---|
| 4,700,346 | A * | 10/1987 | Chandran et al. | 714/700 |
| 5,648,913 | A * | 7/1997 | Bennett et al. | 716/6 |
| 5,812,561 | A * | 9/1998 | Giles et al. | 714/726 |
| 5,880,967 | A * | 3/1999 | Jyu et al. | 716/6 |
| 6,237,127 | B1 * | 5/2001 | Craven et al. | 716/6 |
| 6,405,348 | B1 * | 6/2002 | Fallah-Tehrani et al. | 716/4 |
| 6,553,550 | B1 * | 4/2003 | Menegay et al. | 716/6 |
| 6,584,598 | B2 | 6/2003 | Rao et al. | |
| 6,611,948 | B1 * | 8/2003 | Tyler et al. | 716/6 |
| 6,691,284 | B2 * | 2/2004 | Kashyap | 716/1 |
| 6,829,755 | B2 * | 12/2004 | Gutwin et al. | 716/6 |
| 6,934,922 | B1 * | 8/2005 | Burnley | 716/6 |
| 7,072,821 | B1 * | 7/2006 | Manz et al. | 703/19 |
| 7,219,320 | B2 * | 5/2007 | Kawano et al. | 716/6 |
| 7,222,311 | B2 * | 5/2007 | Kaufman et al. | 716/2 |
| 7,239,997 | B2 * | 7/2007 | Yonezawa | 703/19 |
| 7,243,323 | B2 * | 7/2007 | Williams et al. | 716/6 |
| 7,278,126 | B2 * | 10/2007 | Sun et al. | 716/6 |
| 7,348,797 | B2 * | 3/2008 | Weinraub | 326/40 |
| 7,356,789 | B2 * | 4/2008 | Ly et al. | 716/5 |
| 2002/0144214 | A1 * | 10/2002 | Rao et al. | 716/2 |
| 2002/0198696 | A1 * | 12/2002 | Sanchez et al. | 703/14 |

(Continued)

*Primary Examiner*—Naum B Levin
(74) *Attorney, Agent, or Firm*—Bever, Hoffman & Harms, LLP; Patrick T. Bever

(57) ABSTRACT

A sequential cell is characterized using interdependent setup/hold time pairs to produce associated clock-to-Q delay values, and then identifying setup/hold time pairs that produce a selected clock-to-Q delay value (e.g., 10% of failure). The identified setup/hold time pairs (or a piecewise linear (PWL) approximation thereof) are then stored in a cell library for use in static timing analysis (STA). During STA, the setup and hold skews calculated for each synchronous circuit are compared with a selected setup/hold time pair stored in the cell library (e.g., a pair having a relatively low hold value). If at least one of the setup and hold skews violates the selected setup/hold time pair, then the remaining identified setup/hold time pairs (or the PWL approximation) are utilized to determine if the synchronous circuit is violates established constraints, and if not, to identify the setup and hold times required to remove the violation.

15 Claims, 11 Drawing Sheets

U.S. PATENT DOCUMENTS

2006/0066317 A1* 3/2006 Koch et al. .................. 324/618
2007/0124710 A1* 5/2007 Sakata .......................... 716/5
2007/0136704 A1* 6/2007 Andreev et al. ................ 716/6
2007/0156367 A1* 7/2007 Kucukcakar et al. ........ 702/123

* cited by examiner

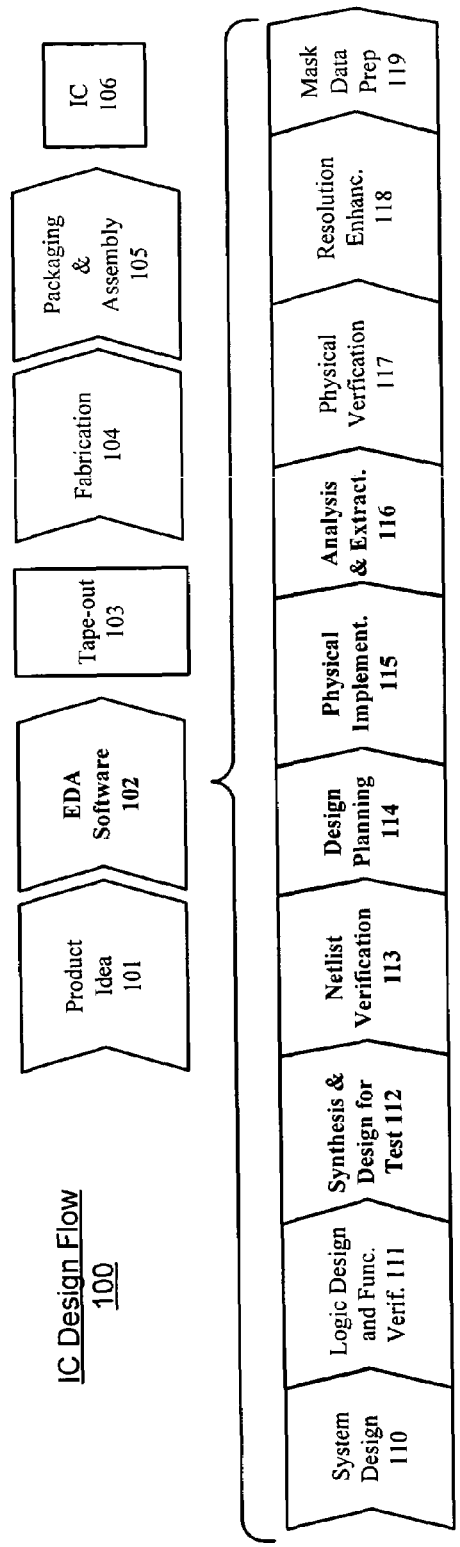
Fig. 1
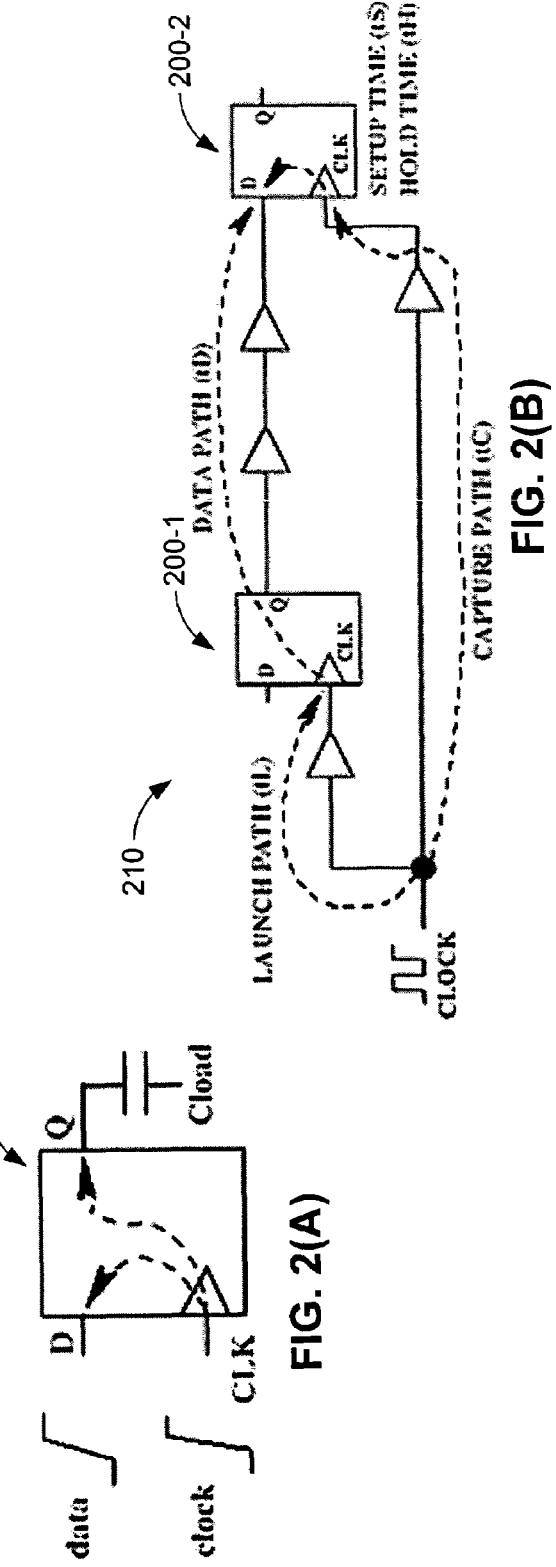
FIG. 2(A)
FIG. 2(B)

CHARACTERIZING SEQUENTIAL CELLS USING INTERDEPENDENT SETUP AND HOLD TIMES, AND UTILIZING THE SEQUENTIAL CELL CHARACTERIZATIONS IN STATIC TIMING ANALYSIS

BACKGROUND OF THE INVENTION

1. Field of the Invention

The present invention relates to methods for characterizing sequential (electronic data storage) cells using interdependent setup and hold times such that the interdependent setup and hold times can be used during static timing analysis, and to static timing analysis tools utilizing interdependent setup and hold times to analyze circuit designs including the sequential cells.

2. Related Art

FIG. 1 illustrates a simplified representation of an exemplary digital integrated circuit design flow 100. At a high level, the process starts with the product idea in step 101. In designing an integrated circuit (IC), engineers typically rely upon computer-implemented tools to help create a circuit schematic design consisting of individual devices coupled together to perform a certain function. In one embodiment, these computer-implemented tools include electronic design automation (EDA) software 102, which can translate the circuit into a physical representation, i.e., a layout. When the layout is finalized, it can be used during tape-out 103. After tape out, fabrication 104 as well as packaging and assembly 105 can proceed to produce the integrated circuit (IC) 106, also called a chip.

Note that EDA software (also called EDA tools) 102 can perform a plurality of steps 110-119, which are shown in linear fashion for simplicity in FIG. 1. In an actual IC design process, various steps may be repeated until certain tests are passed. Moreover, these steps may occur in different orders and combinations. Therefore, these steps are described below for context and general explanation rather than as a specific, or recommended, design flow for a particular IC.

In step 110, engineers can describe the functionality that they want to implement in a system design, perform what-if planning to refine that functionality, and check the costs associated with the system design. Hardware-software architecture partitioning can occur in this step. Exemplary EDA software products from Synopsys, Inc. that can be used at this step include Model Architect, Saber, System Studio, and DesignWare® products.

In step 111, the VHDL or Verilog code for modules in the system design, i.e. the logic design, can be written and then verified for functional accuracy (e.g. checked to ensure that the logic design produces the correct outputs). Exemplary EDA software products from Synopsys, Inc. that can be used in step 111 include VCS, VERA, DesignWare®, Magellan, Formality, ESP and LEDA products.

In synthesis and design for test step 112, the VHDL/Verilog code can be translated to a netlist. This netlist can then be optimized for the target technology. Additionally, tests for checking the finished IC can be designed and implemented. Exemplary EDA software products from Synopsys, Inc. that can be used at this step include Design Compiler®, Physical Compiler, Test Compiler, Power Compiler, FPGA Compiler, Tetramax, and DesignWare® products.

In netlist verification step 113, the netlist can be checked for compliance with timing constraints (referred to herein as static timing analysis, which may also be utilized in steps 112, 114, 115 and 116, and possibly other steps in the EDA flow) and for correspondence with the VHDL/Verilog code. Exemplary EDA software products from Synopsys, Inc. that can be used at this step include Formality, PrimeTime, and VCS products.

In design planning step 114, an overall floorplan for the chip is constructed and analyzed for timing and top-level routing. Exemplary EDA software products from Synopsys, Inc. that can be used at this step include Astro and IC Compiler products.

In physical implementation step 115, the circuit elements of the logic design can be positioned and connected (generally called "place and route"). Exemplary EDA software products from Synopsys, Inc. that can be used in step 115 include the Astro and IC Compiler products.

In analysis and extraction step 116, the circuit function can be verified at a transistor level, thereby permitting what-if refinement. Exemplary EDA software products from Synopsys, Inc. that can be used in step 116 include AstroRail, PrimeRail, Primetime, NanoTime, and Star RC/XT products.

In physical verification step 117, various checking functions can be performed to ensure correctness for manufacturing, electrical issues, lithographic issues, and circuitry. Exemplary EDA software products from Synopsys, Inc. that can be used in step 117 include the Hercules product.

In resolution enhancement step 118, the layout can be manipulated to improve manufacturability of the design. Exemplary EDA software products from Synopsys, Inc. that can be used in step 118 include Proteus, ProteusAF, and PSMGen products.

In mask data preparation step 119, the "tape-out" data for production of masks for lithographic use can be generated. Exemplary EDA software products from Synopsys, Inc. that can be used in step 119 include the CATS® family of products.

Various steps described above, e.g. steps 112-116, require access to a standard cell library that includes standard cells (hereinafter called cells) as well as a database that stores certain integrated circuit (IC) information associated with those cells. This standard cell library can include thousands of cells usable in implementing an IC design. Exemplary standard cells could include flip-flops, logic gates, adders, or other IC devices commonly used in an IC design. Exemplary IC information can include cell pin capacitance, cell output delay, cell output slew, and cell output current. For sequential cells (e.g., flip-flops and latches), conventional standard cell libraries also include setup and hold timing constraint information.

Standalone Static timing analysis (STA) is typically performed during netlist verification (step 113, FIG. 1), and involves determining the validity of a user's circuit design by comparing its simulated performance against imposed performance constraints. The performance differences are measured at each sequential cell, and these performance differences are typically called slacks. Negative slack implies performance violation, i.e., the circuit design will fail to work if implemented in a physical integrated circuit form. A negative slack at a sequential cell results from not meeting the setup time or hold time of the sequential cell.

A simplified sequential cell 200 is illustrated in FIG. 2(A) for purposes of describing STA, and consists of a data input terminal D, a clock input terminal CLK, and an output terminal Q. Sequential cell 200 has two timing arcs (indicated by arrows in FIG. 2(A): one arc from the CLK input to the D input to annotate the setup and hold times, and another arc from the CLK input to the Q output to annotate the CLK-to-Q delay. In STA, D and CLK are referred to, respectively, as an endpoint and a startpoint. The implication of this terminology is that a timing path starts at CLK and ends at input terminal D.

A conventional STA tool reads in a circuit netlist, one or more cell libraries, assertions describing timing analysis guidance and/or constraints, and a clock period T. Actually, a design may have many clocks, each with its own clock period and description. FIG. 2(B) shows a timing path with a single clock T for simplicity. Note that the present invention described below also pertains to instances where the launch clock differs from the capture clock (they may also differ in frequency). An exemplary synchronous circuit 210 is shown in FIG. 2(B), and includes two sequential cells (e.g., D-type flip-flops), startpoint circuit 200-1 and endpoint circuit 200-2, and additional combinational circuitry (not shown) in the data path between startpoint circuit 200-1 and endpoint circuit 200-2. The STA tool analyzes each synchronous circuit 210 of the circuit design against timing constraints defined by the cell library associated with sequential cell 200 and, for example, the clock period T, and reports whether the circuit design performs as intended (i.e., whether all of the synchronous circuits meet the timing constraints, or whether one or more of the synchronous circuits violate the timing constraints). In particular, this analysis is accomplished by computing the worst setup slack (SS) and worst hold slack (HS) at every endpoint. Referring to FIG. 2(B), these slacks are computed as follows:

$$SS=\min(tC+T)-\max(tL+tD+tS) \quad (1)$$

$$HS=\min(tL+tD)-\max(tC+tH) \quad (2)$$

where tC, tL, tD, tS, and tH refer, respectively, to the capture path delay, launch path delay, data path delay, setup time, and hold time of synchronous circuit 210, as illustrated in FIG. 2(B).

If a slack of an associated synchronous circuit is negative or nonnegative, it is said to be violated or satisfied, respectively. If a setup slack is violated, the circuit design can be made to operate correctly by slowing the circuit down, i.e., by increasing T. If a hold slack is violated, the circuit design will not function correctly.

Because nonnegative slacks are required not to have violations, equations 1 and 2 (above) can also be written, respectively, as follows:

$$\min(tC+T)-\max(tL+tD) \geq \max(tS) \quad (3)$$

$$\min(tL+tD)-\max(tC) \geq \max(tH) \quad (4)$$

These inequalities require a difference, called a skew, to be larger than or equal to a number, called a constraint, which is stored in the library associated with each sequential cell 200. These inequalities, therefore, can be rewritten as:

$$\min(\text{setup skew}) \geq \max(\text{setup time}) \quad (5)$$

$$\min(\text{hold skew}) \geq \max(\text{hold time}) \quad (6)$$

Note that the setup and hold skews refer to the time difference between the data and clock signals measured for each synchronous circuit, whereas the setup and hold times refer to the minimum required time difference such that the data is reliably captured and stored by the sequential cell.

A common approach to characterize setup time for a sequential cell is to examine the setup skew versus CLK-to-Q delay relationship at a fixed hold skew, which is called here the counterpart skew. The process is similar for hold time. These approaches are illustrated shown in FIGS. 3(A) and 3(B). According to "Comparative Analysis of Master-Slave Latches and Flip-Flops for High-Performance and Low-Power Systems", V. Stojanovic and V. G. Oklobdzija, IEEE Journal of Solid-State Circuits, Vol. 34, No. 4, pp. 536-548, April 1999, three regions can be determined for both plots: stable, metastable, and failure regions. The stable region is defined as the region in which the CLK-to-Q delay is independent of the setup or hold skew. As the skew decreases, the CLK-to-Q delay starts to rise in an exponential fashion (see M. Shoji, Theory of CMOS Digital Circuits and Circuit Failures, Princeton University Press, 1992). If the skew is excessively small, the sequential cell (register) fails to latch the data. This region is called the failure region. The region between the stable and failure regions is referred to as the metastable region.

The setup and hold times cannot fall in the failure region since the sequential circuit is unable to latch the data in that region. The setup (hold) time is usually set to the setup (hold) skew where the stable region crosses over into the metastable region. There are different approaches to identify this crossover point (see "Comparative Analysis . . . ", cited above). In some approaches, the crossover point is the time where a certain amount of degradation in the CLK-to-Q delay occurs. For example, a 10% degradation is assumed in FIGS. 3(A) and 3(B). In some other approaches, the crossover point is the time where the sum of the setup skew and CLK-to-Q delay is minimized.

The setup and hold times of a given sequential cell are not independent (see U.S. Pat. No. 6,584,598, which is incorporated herein in its entirety); rather, these constraints are a function of the counterpart skews (hold skew for setup time and setup skew for hold time). These dependences are illustrated in FIGS. 4(A) and 4(B). Note that the setup time decreases as the hold skew increases and the hold time decreases as the setup skew increases. Thus, the smallest setup and hold times occur when the counterpart skews are the largest.

The interdependence between the setup and hold times can intuitively be explained as follows. Since the CLK-to-Q delay is dependent of both the setup and hold skews, it can be allocated to either the setup or hold side. For example, if the setup skew is small, this skew dominates the degradation in the CLK-to-Q delay; hence, the hold skew must be relatively large. The same reasoning applies to the hold side. Existing characterization approaches typically ignore the interdependence of the setup and hold times. This strategy leads to two main issues:

Issue 1. If the counterpart skews are assumed to be unnecessarily large, the resulting setup and hold times are optimistic. If, however, the data waveform does not satisfy large counterpart skews, optimistic setup and hold times cause the circuit to fail despite not violating any of the individual constraints. Alternatively, if the counterpart skews are assumed to be unnecessarily small, the resulting setup and hold times are pessimistic. Both cases should be avoided as the optimistic case can cause circuit failures after fabrication whereas the pessimistic case can show as false violations during STA.

Issue 2. If this dependence is considered but not exploited, an opportunity to reduce the number of timing violations and improve the slack is missed. In U.S. Pat. No. 6,584,598 (cited above), the first issue is resolved by considering this interdependence. However, only one interdependent pair of setup and hold times is considered; therefore, the interdependence is not exploited to improve slacks.

The accuracy of the data in cell timing libraries is an important factor in determining maximum clock frequencies T at which a particular circuit design can operate. Specifically, as described above, the setup and hold time constraints of sequential cells are used to verify the timing of a synchronous circuit design. If characterization of the timing constraints is inaccurate, the results can be either highly optimistic or pessimistic. The optimistic case can cause a fabricated circuit to fail whereas the pessimistic case can unnecessarily degrade circuit performance, making it more difficult to achieve a target frequency.

Although the importance of library data accuracy is well known, current constraint characterization practices suffer from both optimism and unnecessary pessimism. These problems are mostly due to the independent characterization of timing constraints.

What is needed is a comprehensive methodology to interdependently characterize setup and hold times for sequential cells, and to exploit the resulting interdependent setup/hold pairs in STA.

SUMMARY OF THE INVENTION

The present invention is directed to methods for characterizing sequential cells using interdependent setup/hold skew pairs, to methods for generating one or more associated cell libraries that include interdependent setup/hold skew information and can be accessed during static timing analysis (STA), to cell libraries generated by these methods, and to STA tools that operate in conjunction with these libraries to greatly improve the analysis of circuit designs including the sequential cell.

In accordance with an embodiment of the present the method begins by generating interdependent clock-to-Q delay values for a sequential cell using wide range of independently varying setup and hold times. The thus-generated interdependent clock-to-Q delay values can be graphically represented as a three-dimensional "delay surface", where the setup and hold times are located in a two-dimensional plane defined by the X- and Y-axes, and each associated interdependent clock-to-Q delay value is positioned a corresponding distance along the Z-axis over its associated setup/hold pair. The resulting delay surface illustrates that clock-to-Q delay is minimized (i.e., at a stable level) when both the setup and hold times are relatively large, and is maximized (i.e., at a breakdown level) when one or both the setup and hold times are too small. Between the stable and breakdown delay values are a non-linear series of metastable values, which are typically characterized by associated setup/hold time pairs having a relatively small setup time and a relatively large hold time, or a relatively large hold time and a relatively small setup time.

After the interdependent clock-to-Q delay values are generated, the method includes identifying a subset of the setup/hold pairs making up the delay surface that produce a predetermined constant delay value (e.g., 10% of the failure point). Due to inherent characteristics of the generated interdependent clock-to-Q delay values, this subset of delay values can be graphically represented as a two-dimensional concave "contour curve" made up of a series of sequentially arranged setup/hold pairs.

The series of setup/hold pairs associated with the contour curve are then used to generate one or more libraries that can be accessed and utilized by a STA tool to analyze the synchronous circuits of a target circuit design. During STA, each synchronous circuit is analyzed and its resulting setup and hold skews are compared with the timing data stored in the cell library. When a particular synchronous circuit's setup and hold skews have a first relationship with respect to the series of setup/hold pairs (i.e., "inside" the concave portion of the contour curve), then the synchronous circuit is deemed valid (i.e., it satisfies the timing constraints stored in the cell library). By utilizing interdependent setup/hold values in this manner, highly reliable STA results are generated that eliminate both the optimistic and pessimistic characteristics associated with conventional independent setup/hold approaches. Conversely, when a particular synchronous circuit's setup and hold skews have a second relationship with respect to the series of setup/hold pairs (i.e., "outside" the concave portion of the contour curve), then the sequential cell is identified as violating timing constraints, and the series of setup/hold pairs are utilized to identify a "best pair" of setup/hold values on the contour curve that can be used to optimize the circuit design.

In accordance with a specific embodiment of the present invention, in order to minimize the amount of information stored in the cell library, two or more critical setup/hold pairs located on the contour curve are identified and stored in the cell library. The identified setup/hold time value pairs (or a piecewise linear (PWL) approximation thereof) are then utilized during STA to analyze the synchronous circuits of the target circuit design, whereby safe and continuous interpolation between the identified setup/hold pairs is achieved. In one embodiment, the STA process begins by comparing the calculated setup and hold skews of a particular synchronous circuit with a selected setup/hold time pair stored in the cell library (e.g., an "effective hold pair" having a relatively low hold value). If at least one of the setup and hold times violates the selected setup/hold pair, then the remaining identified setup/hold pairs (or the PWL approximation) are utilized to determine, through interpolation, if the sequential cell violates the timing constraints defined by the PWL approximation, and if so, to compute the maximum setup and hold times required to remove the violation. Note that the "violation" term is used in generic way. The methods described here are targeted to improve slack whether it is negative or positive. The most applicable usage of the method is to eliminate negative slack (i.e., understanding that a circuit that is estimated to be non operational would actually work).

In accordance with an aspect of the present invention, a STA process begins by analyzing a synchronous circuit using conventional independent setup/hold time values, and then utilizes the interdependent setup/hold time values when violation of the independent setup/hold time values is detected. This type two-phase approach (although not required) may save processing time in that the interdependent setup/hold time analysis may require more time than the independent analysis. This two-phase approach may be particularly advantageous when analyzing synchronous circuits including transparent latches. In particular, the independent setup/hold time values may be used where there is time to borrow, and the interdependent technique used for transparent latches that cannot borrow any more time (i.e., have a violation).

In accordance with embodiment of the present invention, a cell library includes one or more interdependently generated setup/hold time pairs that can be accessed in the manner described above during STA.

In accordance with yet another embodiment, a modified STA tool includes means for comparing the setup and hold skews calculated for a given synchronous circuit with an interdependent setup/hold time pair, or with a PWL approximation generated by two or more interdependent setup/hold time pairs, in the manner described above.

BRIEF DESCRIPTION OF THE FIGURES

These and other features, aspects and advantages of the present invention will become better understood with regard to the following description, appended claims, and accompanying drawings, where:

FIG. 1 illustrates a simplified representation of an exemplary digital integrated circuit design flow.

FIGS. 2(A) and 2(B) illustrate a simplified sequential cell and a synchronous circuit including the sequential cell.

DETAILED DESCRIPTION OF THE FIGURES

Figure 3A:
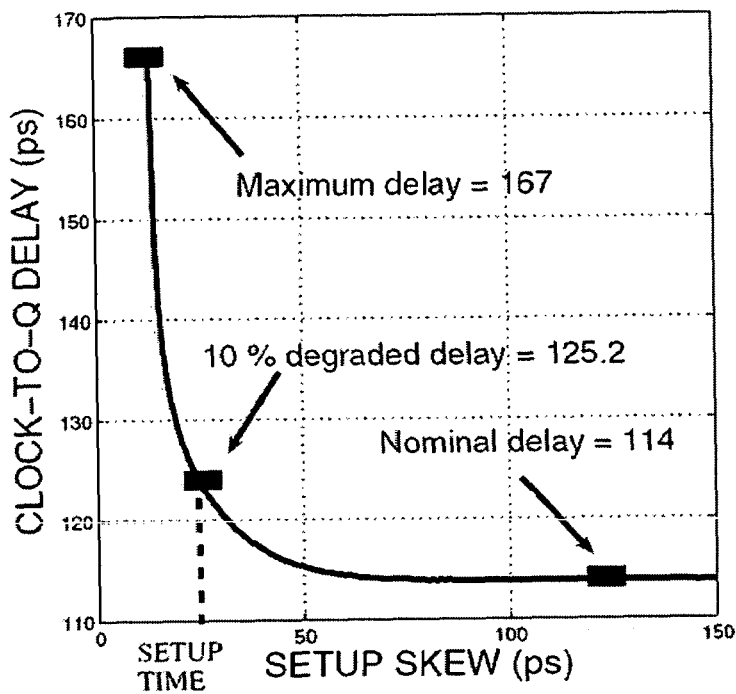
FIGS. 3(A) and 3(B) are graphs depicting independent relationships between clock-to-output (CLK-to-Q) delay times and setup and hold times, respectively.
Figure 3B:
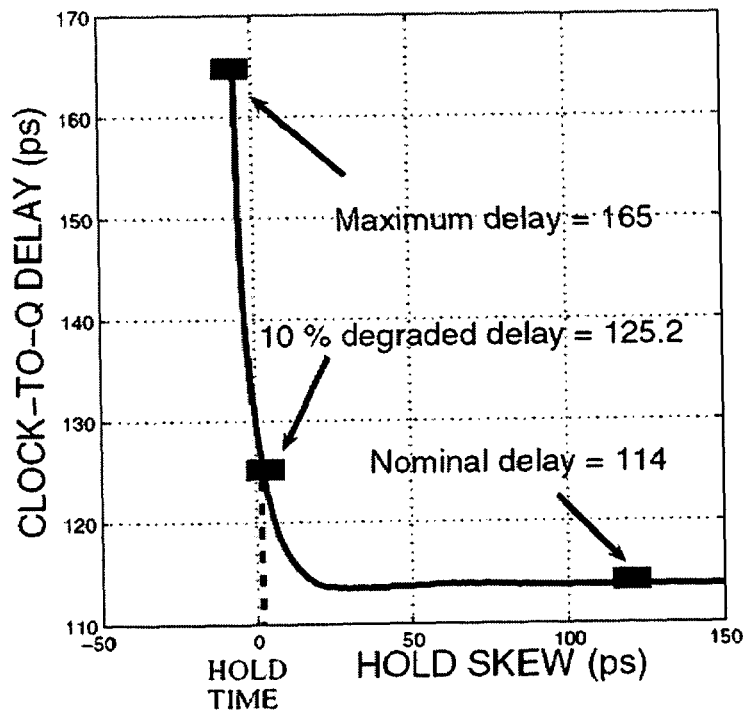
Figure 4A:
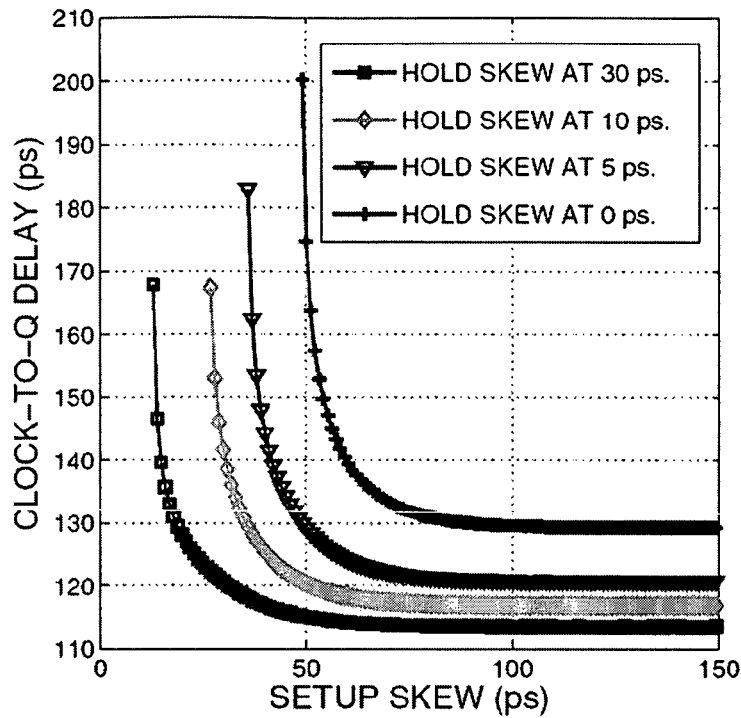
FIGS. 4(A) and 4(B) are graphs depicting interdependent relationships between clock-to-output (CLK-to-Q) delay times and setup and hold times.
Figure 4B:
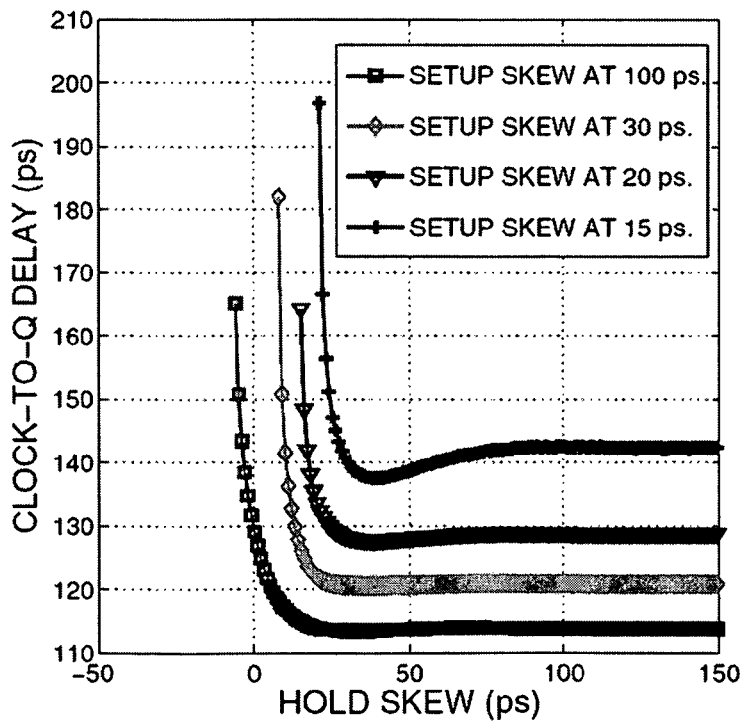
Figure 5:
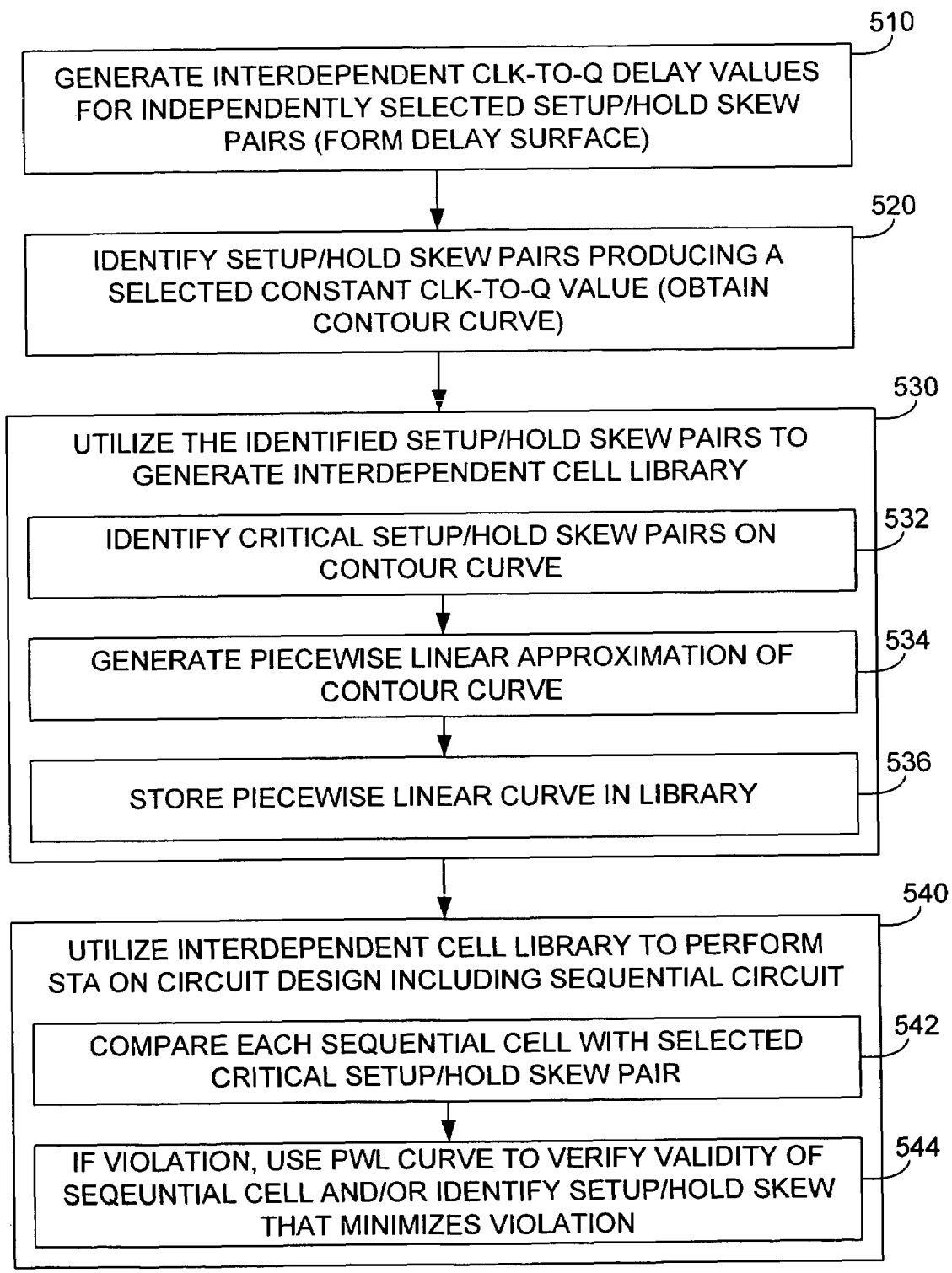
FIG. 5 is a flow diagram depicting a method for creating a cell library containing interdependent setup/hold pairs according to an embodiment of the present invention.

FIG. 5 is a flow diagram illustrating exemplary procedures, in accordance with an embodiment of the present invention, for creating a cell library containing interdependent setup/hold time data (blocks 510 to 530), and for subsequently utilizing the library to perform static timing analysis (STA) on a circuit design (block 540). Those skilled in the art will recognize that the exemplary procedures are simplified for explanatory purposes. Further, although the following example makes specific reference to synchronous circuit 210 shown in FIG. 2(B), the present invention may also be utilized to analyze asynchronous circuits that include sequential cells.

Referring to the top of FIG. 5, creating the library begins by generating interdependent CLK-to-Q (clock-to-output) delay values for a selected sequential cell using a wide range of independently selected setup/hold time pairs (block 510). For a selected sequential cell (e.g., a flip-flop), the interdependent delay values are determined, for example, by the data and clock slew used during operation of the target circuit design.

Therefore, a separate set of interdependent delay values are preferably generated for each data and clock slew combination, and each of the sets is used to generate an associated library or libraries. Because these sets of interdependent delay values is are formed in substantially the same manner, the generation of only one set of interdependent delay values is described below for brevity.

Figure 6:
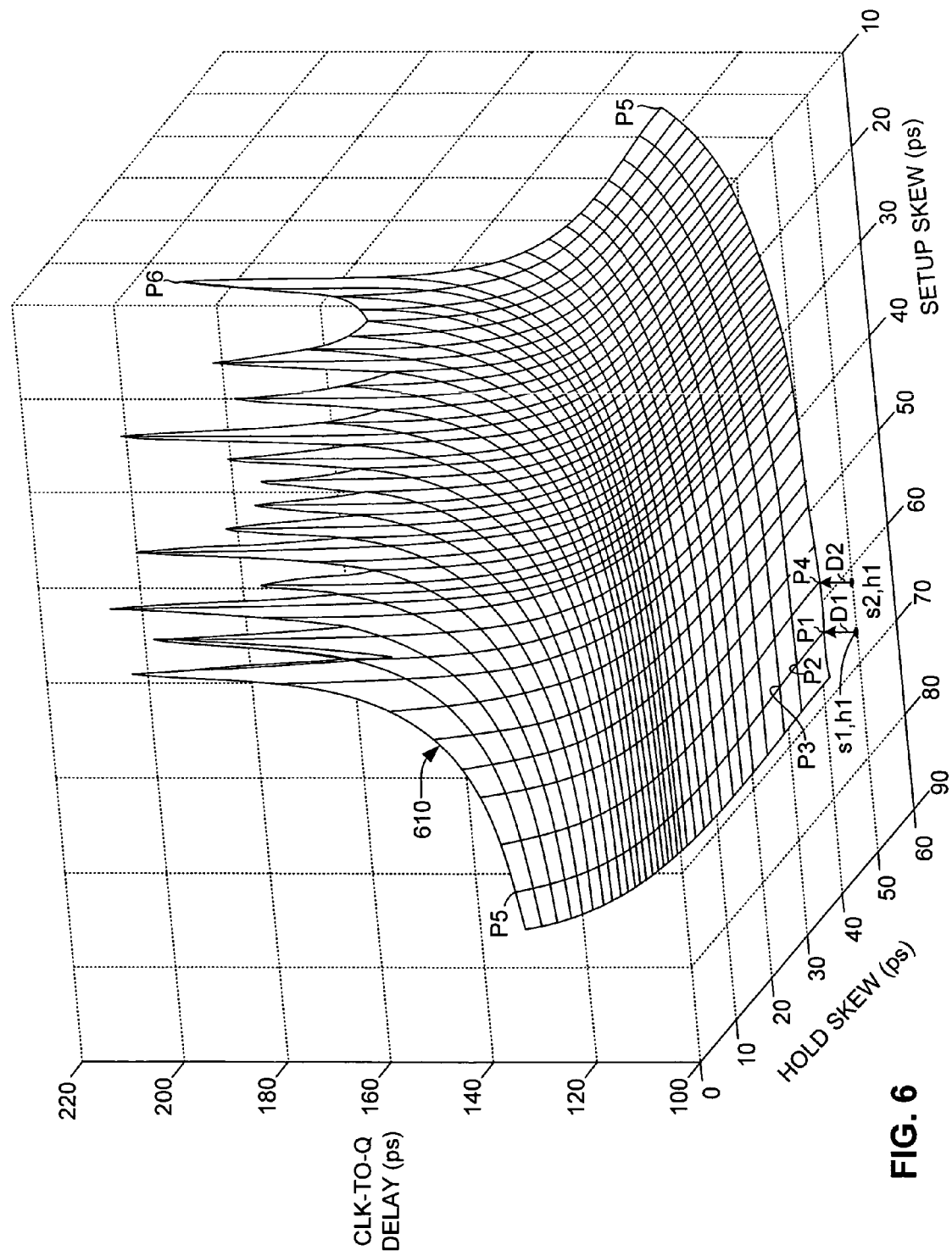
FIG. 6 is a perspective depiction of a delay surface generated in accordance with an embodiment of the present invention.

FIG. 6 is a perspective view showing a CLK-to-Q delay surface 610, which forms a graphical representation of the delay values generated in accordance with the procedure of block 510. Those skilled in the art will recognize that delay surface 610 is not physically formed during the delay value generating process, but merely provides a graphic representation of the delay values that is useful for explanatory purposes.

As indicated by the dashed lines in FIG. 6, delay surface 610 is superimposed over a orthogonal grid in which the horizontal (X- and Y-) axes are hold time and setup time, respectively, and the vertical (Z-) axis is CLK-to-Q delay. The exemplary values are represented in pico-seconds (ps). Delay surface 610 is defined by an array of intersecting lines, where each intersection point (e.g., point P1) is determined by an interdependent delay value (e.g., D1) that in turn is generated by an associated setup/hold pair (e.g., setup/hold pair s1,h1). That is, for each setup/hold pair, an associated interdependent delay value is calculated or otherwise determined, and that delay value forms a corresponding intersection point on delay surface 610. Those skilled in the art will recognize that the number of such intersecting points is randomly selected, and the resolution of delay surface 610 may be increased or decreased by increasing or decreasing the number of setup/hold pairs (i.e., the number of intersection points).

In accordance with an aspect of the present invention, the delay values represented by delay surface 610 are generated by independently selected setup times and hold times. In one embodiment, the process of independently selecting setup times and hold times involves selecting a setup time (e.g., s1) and a first hold time (e.g., h1), calculating the associated delay value (e.g., D1), and then independently varying the hold time. The process of independently varying the hold time is depicted in FIG. 6 by intersection points P2 and P3, which indicate, for the fixed setup time (i.e., s1), delay values generated at two sequentially decreasing hold times. Once a "row" of intersection points is generated for the selected setup time, a new setup time is selected (e.g., setup time s2), and the process is repeated for the series of hold times (e.g., starting with hold time h1) to generate a new "row" of delay values (e.g., D2), which may be used to produce corresponding intersection points (e.g., P4) of delay surface 610. Delay surface 610 is thus generated by independently varying the setup and hold times. Independent variation allows the generation of the actual delay surface, and simplifies the library characterization process (described below) at the expense of additional circuit simulations.

Note that the CLK-to-Q delay values increase when the setup and hold times either independently or simultaneously decrease. For example, the interdependent delay value generated at intersection point P5, which represents a relatively low hold time value, is substantially higher than, for example, at hold time value h1 for a given setup time. Similarly, the interdependent delay value generated at intersection point P6, which represents a relatively low setup time value, is substantially higher than, for example, at setup time value s1 for a given hold time. When both the hold time and the setup time are relatively low (e.g., at intersection point P6), the delay values-tend to be maximized, and periodically reach the critical failure point (described above). Thus, the multiple peaks on delay surface 610 mark the boundary beyond which the times are excessively small and the sequential cell can no longer latch the data.

Note also that the "area" defined by delay surface 610 is selected such that interdependent delay values range from stable (minimum) delay values (e.g., delay D1 at intersection point P1) to failure (maximum) values (e.g., the failure value depicted at point P6), and include a large number of metastable (intermediate) delay values (e.g., depicted intersection point P5) that are located between the stable and failure delay values.

Returning to FIG. 5, after the interdependent CLK-to-Q delay values are generated in block 510, a subset of the setup/hold time pairs are identified that produce a selected constant CLK-to-Q delay value (block 520). The selected constant CLK-to-Q delay value is typically associated with the metastable region of delay values, and is commonly referred to as a crossover point. A definition of a common crossover point is a specific percent degradation in the CLK-to-Q delay (e.g., 10% of the failure value relative to the stable value).

Figure 7:
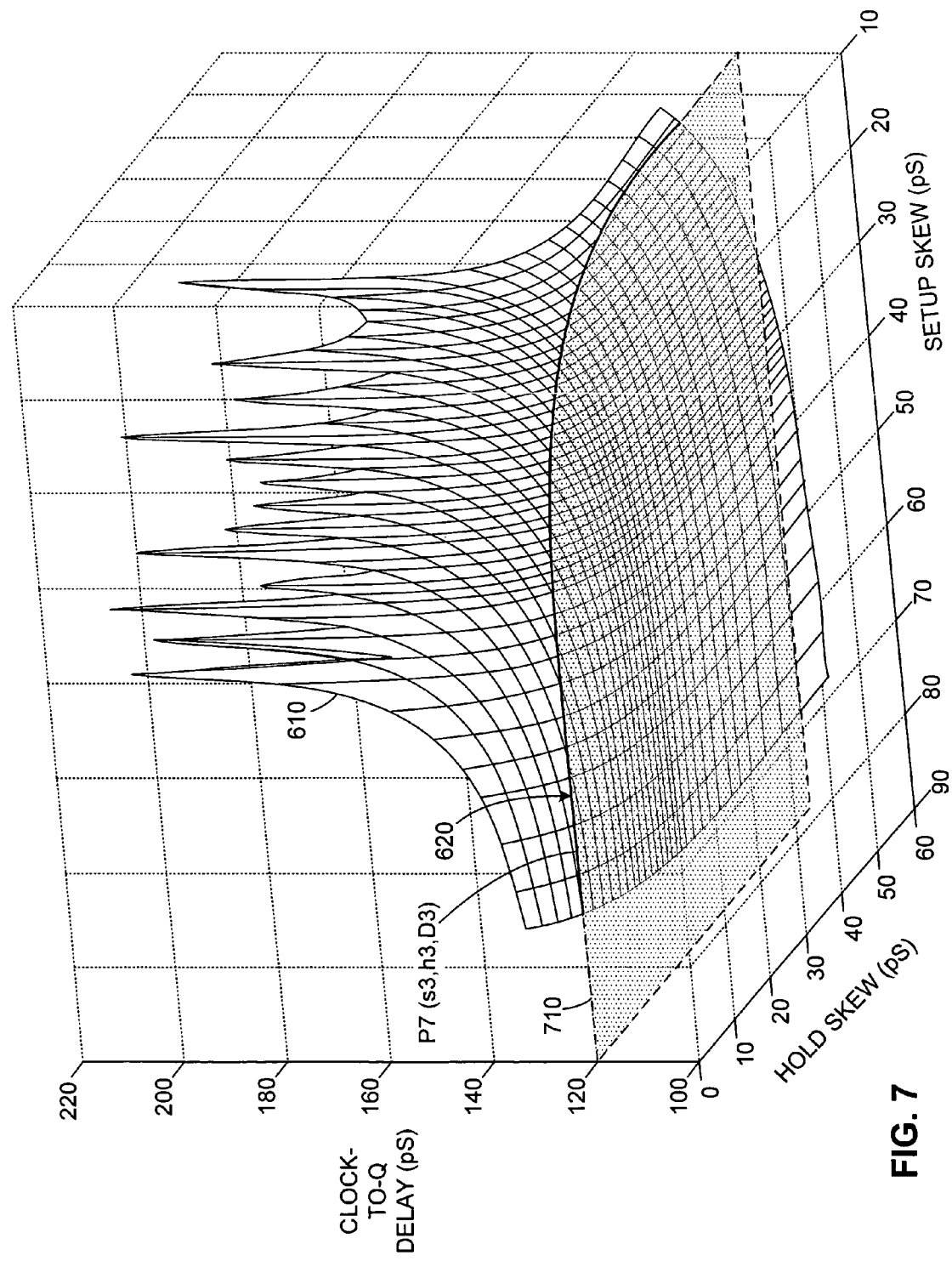
FIG. 7 is a perspective depiction of the delay surface of FIG. 6, and further depicting the generation of a contour curve in accordance with another embodiment of the present invention.

FIG. 7 is a perspective view showing CLK-to-Q delay surface 610 (described above), and further includes a plane 710 that graphically represents the process for selecting the subset of setup/hold time pairs. Plane 710 intersects delay surface 610 to define a contour curve 620 (indicated by thick line), which represents all intersection points of delay surface 610 that are located at the crossover point (i.e., have a selected constant delay value of, for example, 120 ps). Thus, plane 710 graphically depicts the process of identifying a subset of the setup/hold pairs that generate intersection points located on delay surface 610 and have the selected CLK-to-Q delay value. For example, intersection point P7 has a delay D3 that is defined by setup/hold pair s3,h3. Due to the inherent nature of delay surface 610, this process typically generates contour curve 620 such that it has a concave shape, with the closed end of the concave shape being located adjacent to the minimum setup and hold time values.

Returning to FIG. 5, after the subset of setup/hold time values defining contour curve 620 is identified, these setup/hold time pairs are utilized to generate a cell library for the associated sequential cell that can be accessed by a STA tool to analyze the target circuit design. The general approach utilized in generating the library is described below with reference to FIG. 8(A), and a practical embodiment of the approach is described below with reference to FIG. 8(B).

Figure 8A:
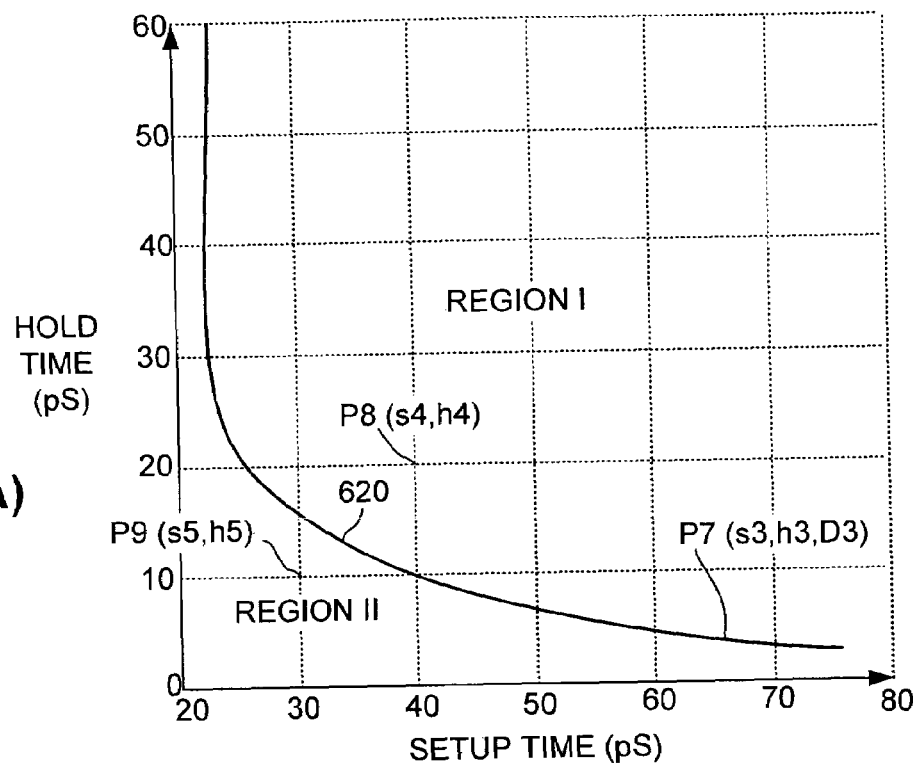
FIG. 8(A) is a two-dimensional representation of the contour curve depicted in FIG. 7.

FIG. 8(A) is a two-dimensional (e.g., top plan) view of the graph shown in FIG. 7, and shows the concave shape of contour curve 620 without the other features of the delay surface shown in FIGS. 6 and 7. Note that setup times are delineated on the horizontal axis, and hold times are delineated on the vertical axis in FIG. 8(A). Contour curve 620 generally divides the setup/hold time pairs into two regions: Region 1, which is located on the inside (concave side) of contour curve 620, and Region II, which is located on the outside (convex side) of contour curve 620. Setup/hold pairs located inside Region I (e.g., intersection point P8, which is located at setup time s4 (40 ps) and hold time h4 (20 ps)) have delay values that are lower than the constant delay value of contour curve 620, and therefore represent valid setup/hold pairs. Conversely, setup/hold pairs located in Region II (e.g., intersection point P9, which is located at setup time s5 (30 ps) and hold time h5 (10 ps)) have delay values that are higher than the constant delay value of contour curve 620, and therefore represent setup/hold pairs that violate the established timing constraint (i.e., the maximum delay defined by contour curve 620). Each setup/hold time pair generating an intersection point on contour curve 620 (e.g., s3,h3) is interdependent and valid (i.e., does not generate a timing violation). Thus, by forming a library of setup/hold pairs that coincide with contour curve 620 (or, as described below, two or more "critical" setup/hold pairs that can be used to approximate contour curve 620), this library can be used during STA to verify a substantially higher number of synchronous circuits than is possible using the independent setup and hold time value approach associated with the prior art. In other words, by storing the setup/hold time pairs that define contour curve 620 (or an approximation thereof) in a library, and then by utilizing this library and known mathematical techniques during STA to determine whether the setup skew and hold skew associated a particular synchronous circuit are in Region I or Region II, the present invention facilitates a highly valuable approach for identifying valid synchronous circuits that could otherwise be identified as violating timing constraints using conventional techniques. Further, as described below, the library provides the additional function of providing valuable information for synchronous circuits that violate timing constraints by facilitating the quantification of the amount of violation in a way that can be used to rectify the violation in a highly efficient manner.

Two important conclusions can be drawn from contour curve 620. First, rather than single and independent setup and hold times, there are multiple and interdependent (setup time, hold time) time pairs. Any setup/hold pair can be chosen depending upon the potential to remove timing violations. Second, as indicated by contour curve 620 in FIG. 8(A), the setup and hold times are inversely proportional. Hence, a small setup time can be obtained at the expense of a large hold time (and vice versa).

Those skilled in the art will recognize that storing all of the setup/hold pairs defining contour line 620 in a cell library would significantly increase the processing time required to perform STA using the library. Hence, as suggested above, in accordance with an aspect of the present invention, a simplified approximation of contour curve 620 is identified and utilized to generate a library having a manageable size (i.e., such that STA can be performed in a reasonably short amount of time). A smaller library means that the STA tool can load that library faster with less memory, thereby advantageously reducing the memory and CPU time usage by the STA tool. One such approximation, which utilizes critical setup/hold pairs and piecewise linear (PWL) approximation is described below. Those skilled in the art will recognize that other approximations may be utilized as well, all of which are intended to be included in the scope of the appended claims unless otherwise specified.

The following definitions are used to define critical setup/hold pairs on contour line 620 according to an embodiment of the present invention. These setup/hold pairs are distinguished because these pairs are appropriate candidates to include in a cell library.

Definition 1: P is defined as the set of all (s,h) pairs on the contour where s is the setup time and h is the hold time.

Definition 2: S and H are defined as the set of all setup times s and hold times h on the contour, respectively.

Definition 3: The minimum setup pair MSP is defined as the pair (s,h) in P such that s is minimum in S.

More Formally:

$$MSP = (s, h) \in P \text{ such that } s = \min_{\forall s \in S}(s). \qquad (7)$$

Definition 4: The minimum hold pair MHP is defined as the pair (s,h) in P such that h is minimum in H.

More Formally:

$$MHP = (s, h) \in P \text{ such that } h = \min_{\forall h \in H}(h). \quad (8)$$

Definition 5: The effective setup pair ESP is defined as:

$$ESP=(s,h) \in P \text{ such that } s=s[MSP]+\in_s *|s[MSP]|, \quad (9)$$

where $\in_s \geq 0$ is a small constant and s[MSP] is the setup time of MSP.

Definition 6: The effective hold pair EHP is defined as:

$$EHP=(s,h) \in P \text{ such that } h=h[MHP]+\in_h *|h[MHP]|, \quad (10)$$

where $\in_h \geq 0$ is a small constant and h[MHP] is the setup time of MHP.

Definition 7: The minimum setup-hold pair MSHP is defined as:

$$MSHP = (s, h) \in P \text{ such that } s + h = \min\left\{\sum_{\forall (s,h) \in P}(s + h)\right\}. \quad (11)$$

Figure 9A:
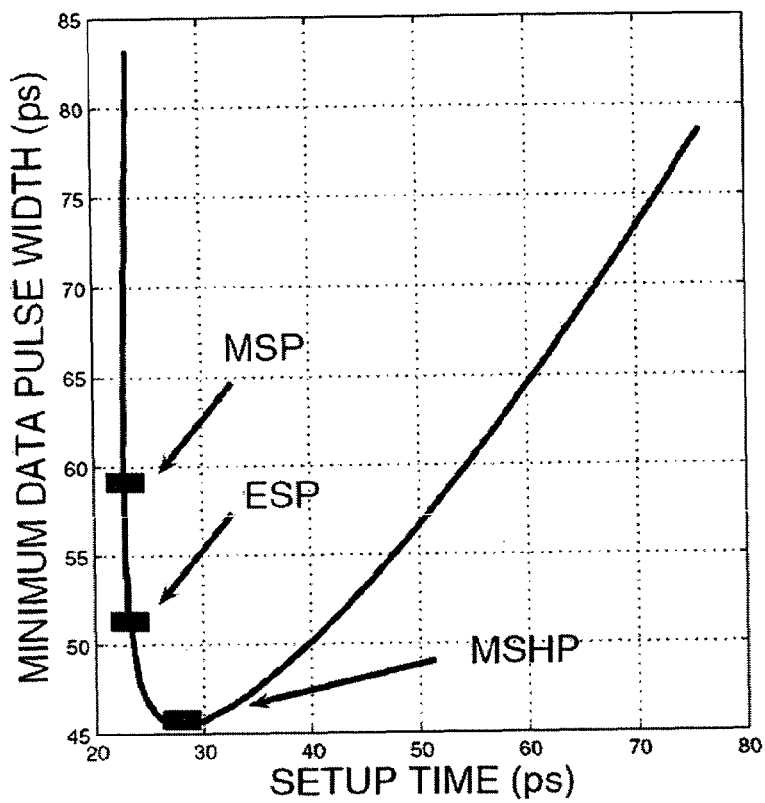
FIGS. 9(A) and 9(B) are graphs depicting the relationship between minimum data pulse widths and various setup and hold points.
Figure 9B:
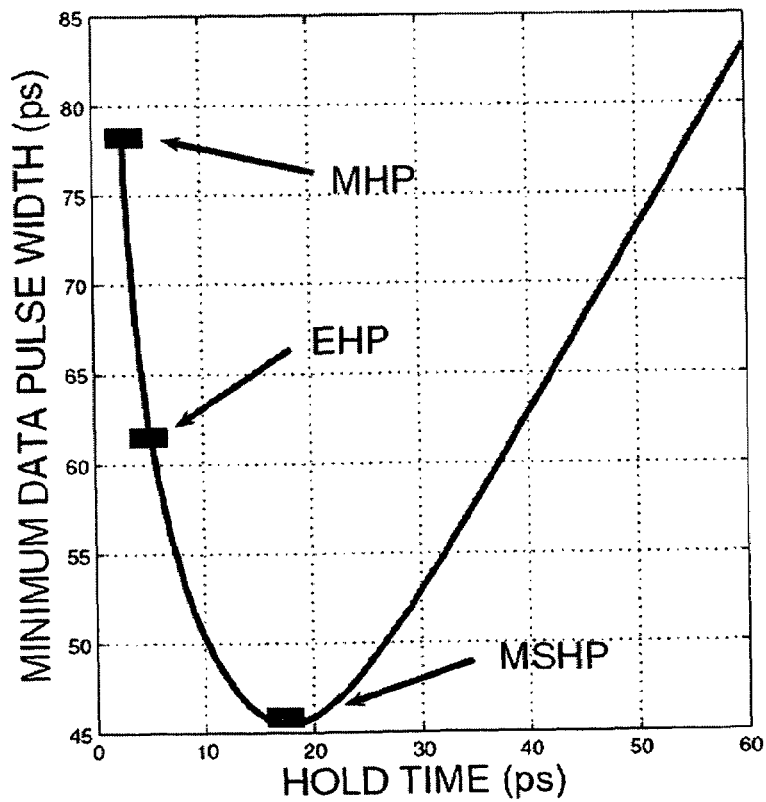

The relationships between the critical pairs defined above, and their relationship to the minimum pulse width for the setup skew and the hold skew, respectively, are graphically depicted in FIGS. 9(A) and 9(B).

A distinction is made between the MSP (minimum setup pair) and the ESP (effective setup pair) because MSP requires an impractically large hold time. That is, the setup time must be increased by $100 \in_s \%$ in order to reduce the hold time to an acceptable level.

The distinction between the minimum and effective pairs can be illustrated by considering the minimum pulse width of the data signal. The minimum pulse width of the data signal is determined by summing the setup and hold times.

The variation of the minimum pulse width with respect to the setup and hold times is shown in FIGS. 9(A) and 9(B). Note that if minimum constraints are used rather than effective constraints, the minimum pulse width increases significantly. At zero $\in_s$ and $\in_h$, the effective constraints are equal to the minimum constraints.

In order to fully exploit the setup/hold interdependency, a STA tool should use more than one (setup time, hold time) pair by switching between multiple pairs such that the violations can be removed or improved. Because cell libraries require time and memory to generate and store, these libraries cannot be generated at every point on contour curve 620. An appropriate strategy is to generate one cell library per critical pair. The resulting libraries, however, can be insufficient to remove all violations. An improvement is to approximate the contour using a PWL curve that is aligned with the critical pairs.

Referring again to block 520 of FIG. 5, in accordance with one embodiment, this approximation is performed by identifying two or more of the critical setup/hold pairs (defined above) on the contour curve (block 532), generating a PWL approximation of the contour curve using the critical setup/hold pairs (block 534), and then storing at least one of the two or more critical setup/hold time pairs and the PWL approximation curve in said library (block 536). Once the setup/hold pairs and PWL approximation are determined, the process of generating the cell library for use by an STA tool is performed using known techniques (e.g., once the setup/hold pairs and PWL approximation curve are determined, the information is stored in a library that can be read by an STA tool).

Figure 8B:
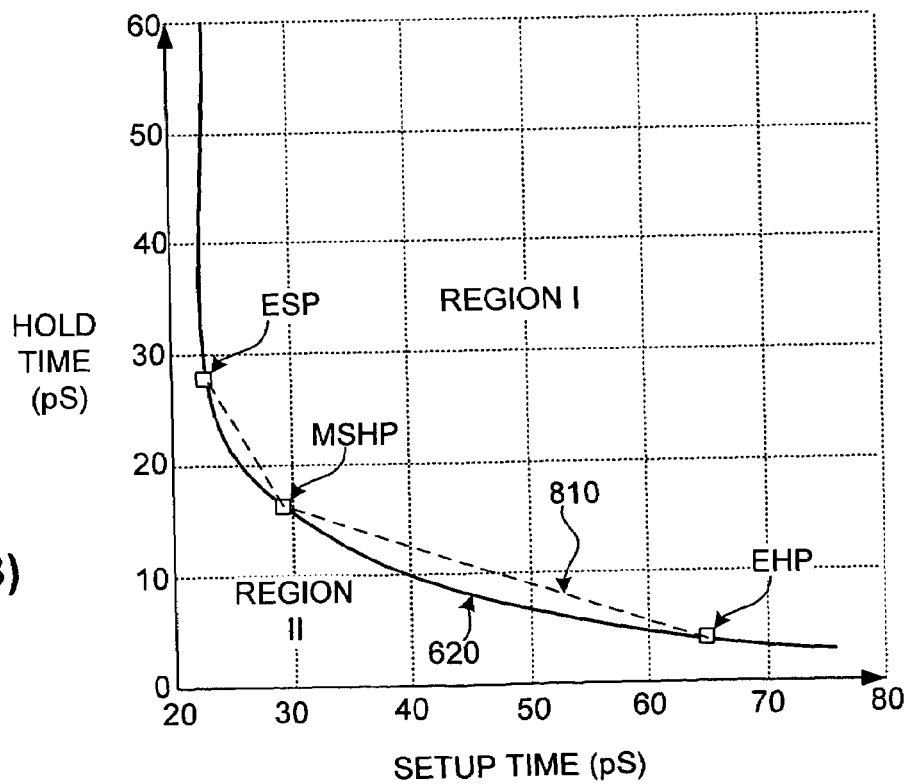
FIG. 8(B) includes the two-dimensional representation of FIG. 8(A), and further illustrates a piecewise linear (PWL) approximation thereof.

FIG. 8(B) depicts an approach for generating a PWL approximation 810 utilizing an effective hold pair EHP, an effective setup pair ESP, and a minimum setup-hold pair MSHP. Effective hold pair EHP, effective setup pair ESP, and minimum setup-hold pair MSHP are determined as set forth above. The section of the contour between ESP and EHP is always convex (see, for example, H. G. Eggleston, Convexity, Cambridge University Press, 1958). As such, PWL approximation 810 remains in Region I (i.e., inside contour curve 620), and the setup and hold time pairs located on PWL approximation 810 cannot be optimistic. If, however, the contour section between ESP and EHP is not convex, a smaller but convex section needs to be determined to enable a PWL approximation.

Figure 10A:
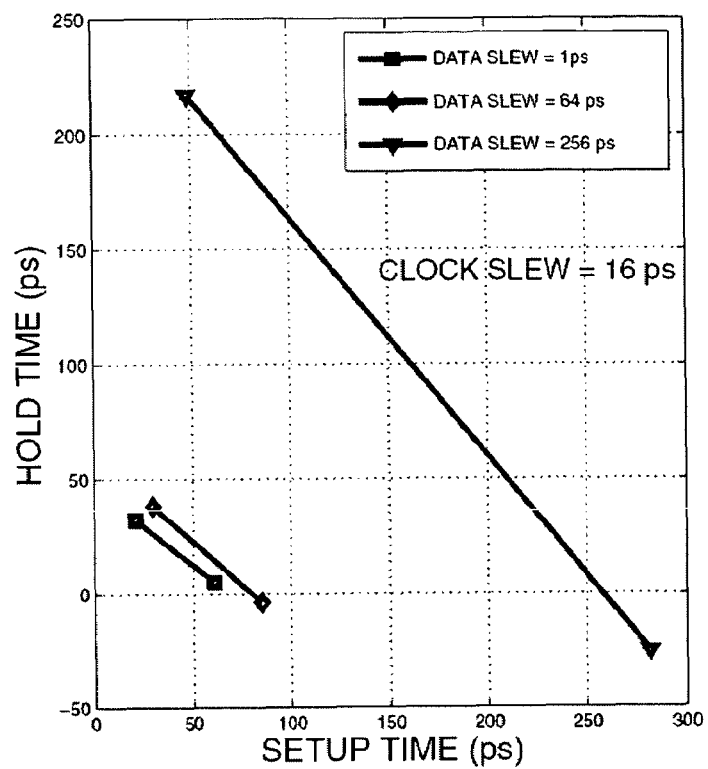
FIGS. 10(A) and 10(B) are graphs depicting interdependent setup and hold times at different data slews and clock slews, respectively.
Figure 10B:
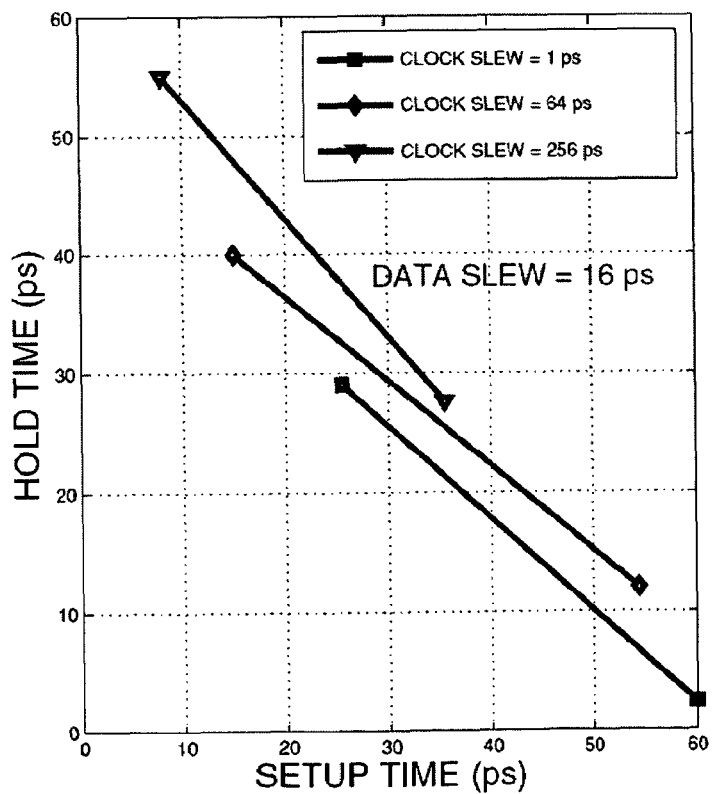

The linear representation of the contour at three different data and clock slew pairs is shown in FIGS. 10(A) and 10(B). Each linear curve is obtained using ESP and EHP on the contour curve. Note that the number of critical pairs used in the PWL curve represents a tradeoff between accuracy and complexity.

Returning to FIG. 5, after an interdependent cell library is generated using the techniques described above, the library may be utilized by a STA tool to perform STA on a circuit design that includes synchronous circuits incorporating the characterized sequential cell (block 540). In accordance with one embodiment of the present invention, the STA involves analyzing each synchronous circuit to determine its associated setup and hold skew, and comparing the associated setup and hold skew with a selected critical setup/hold pair stored in the library (block 542). If a possible timing constraint violation is detected based on the comparison with the selected critical setup/hold pair, then the PWL approximation is utilized to verify that the associated setup skew and associated hold skew actually violate a predetermined timing constraint (block 544). Table 1 (below) includes pseudo-code for a proposed algorithm FIND-BEST-PAIR, which represents an efficient algorithm that can be used to fully exploit an interdependent cell library according to a specific embodiment of the present invention. The FIND-BEST-PAIR algorithm reads in the PWL approximation stored in the cell library, calculates a hold slack HS and setup slack SS for each synchronous circuit, determines whether a timing constraint is violated, and identifies a "best pair" (closest valid setup/hold pair on the PWL approximation) if a violation exists.

TABLE 1

FIND-BEST-PAIR

1. Select a valid pair (s0,h0) from PWL
2. Calculate hold slack = HS
3. Calculate setup slack = SS
4. if (HS $\geq$ 0 and SS $\geq$ 0) then
5. return < (s0,h0),found >
6. else
7. Calculate max. required setup time = RST = s0 + SS
8. Calculate max. required hold time = RHT = h0 + HS
9. for each (s,h) $\in$ PWL do
10. if (s $\leq$ RST and h $\leq$ RHT) then
11. return < (s,h),found >
12. return < (RST,RHT), not found >

Specifically, the FIND-BEST-PAIR algorithm reads in the PWL approximation (PWL) of the contour curve as an input from the cell library. At line 1, a (setup time, hold time) pair is selected from the library input. This pair can be any of the critical pairs on PWL, but it is suggested here to use EHP, as hold times are typically more critical. The setup and hold slacks for a synchronous circuit are then determined as described above (lines 2 and 3). Both slacks are checked for violations (line 4). If both are nonnegative, the algorithm terminates, returning the s0,h0 pair as the "best" pair (line 5). If one or both of the slacks are negative, these slacks are used to compute the maximum setup and hold times required to remove the violations (lines 7 and 8). The loop at line 9 determines if such a pair actually exists in PWL. If so, the pair is returned as the best pair (lines 10 and 11). If no such pair exists in PWL, then required setup and hold times are returned with a warning that no solution is possible (line 12). The required setup and hold times can be used to search for a pair that minimizes the violations. Note that the search at line 9 can be optimized using known techniques from computational geometry to determine the relative location of a point with respect to a line.

Figure 11:
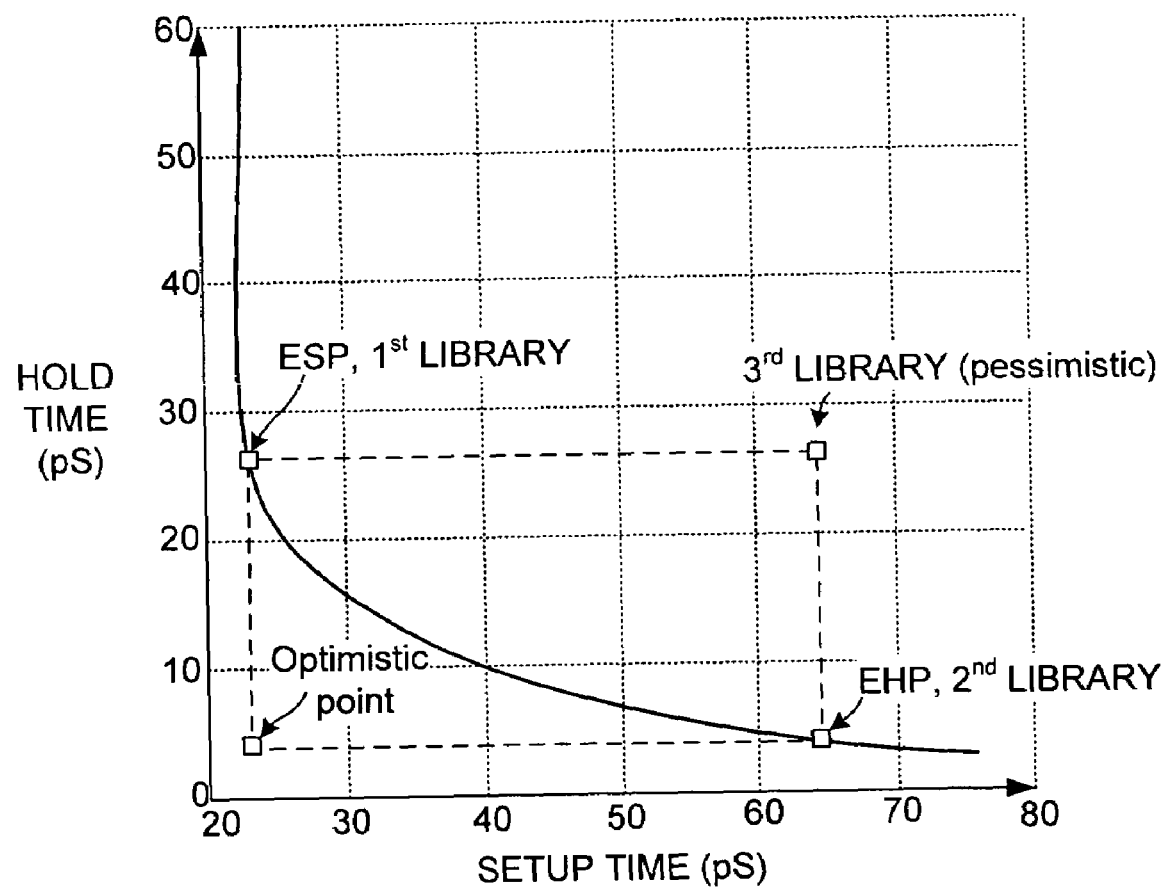
FIG. 11 is a graphical depiction illustrating library characterization points utilized in an exemplary embodiment of the present invention.
Figure 12A:
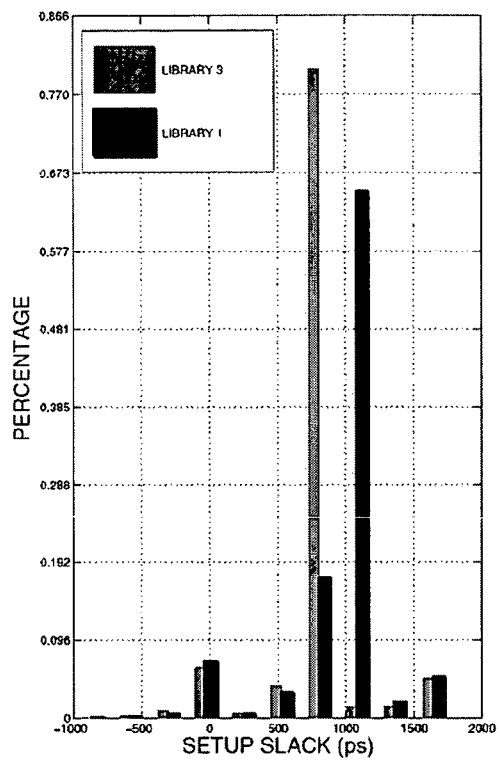
FIGS. 12(A), 12(B), 13(A) and 13(B) are histograms showing STA results using various library characterization points in an exemplary embodiment of the present invention.
Figure 12B:
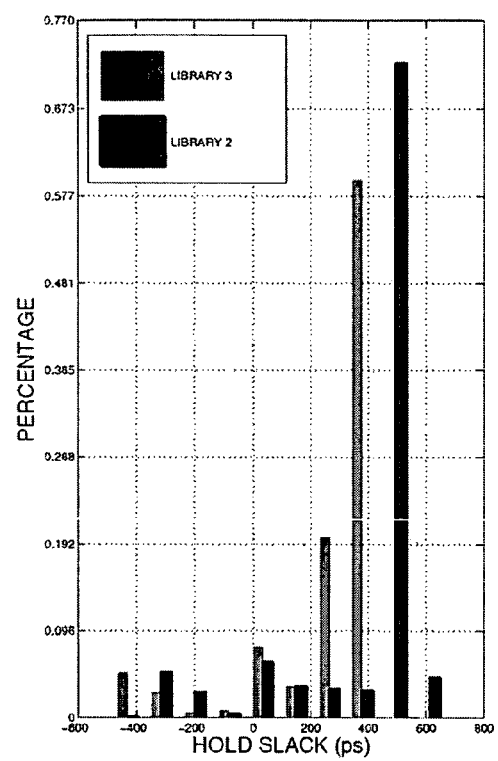
Figure 13A:
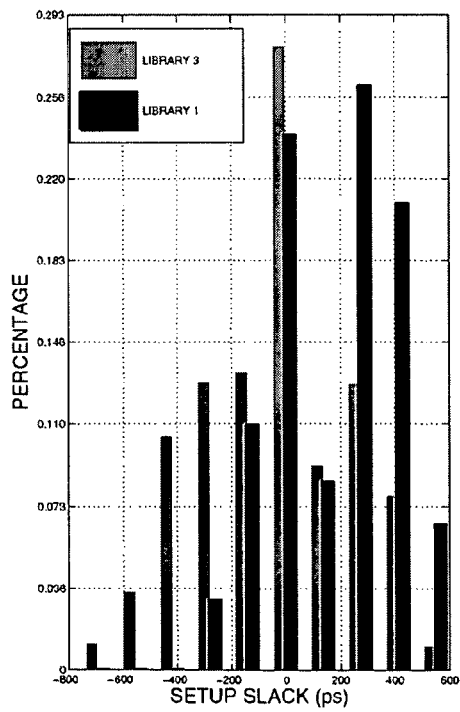
Figure 13B:
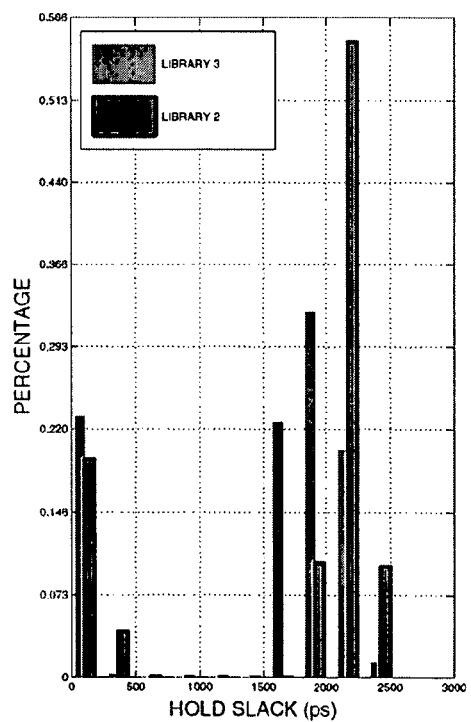

The primary limitations of the proposed methodology are twofold: (1) the constraint characterization time increases for sequential cells, and (2) the STA runtime increases. The first limitation is due to the generation of the delay surfaces, and the second limitation is due to the use of multiple constraints during STA. These limitations can be mitigated as follows: (1) a single characterization run can generate all of the constraints at each critical pair; (2) the number of independent skews for the delay surfaces can be reduced, i.e., those timing pairs that do not change the delay surface can be eliminated; and (3) the number of critical pairs can be reduced to two (at the expense of some pessimism). A 90 nm library is used as a template to generate three new cell libraries: library 1, library 2, and library 3. The sequential cells of each library are characterized using H-SPICE with BSIM4/BSIM3 models. The library characterization points for these three libraries are illustrated in FIG. 11. Both library 1 and 2 are on the contour: library 1 is at the ESP (effective setup pair) and library 2 is at the EHP (effective hold pair). Library 3 is not on the contour; this last library uses setup times from EHP and hold times from ESP, and as such, is an example of independent and pessimistic characterization. The optimistic point that results from using relatively large counterpart skews is also shown in FIG. 11. An industrial sign-off STA tool is used to evaluate each prototype library on two circuit designs: circuit A and circuit B. Both circuit designs are networking cores with nearly 20K cells. The clock frequencies of circuit A and circuit B are set to 666 MHz and 400 MHz, respectively. From STA, the smallest negative slack value, referred to as the worst negative slack (WNS), and the number of violations are obtained for each of the endpoints. The STA results are listed in Tables 2A and 2B (below), which show the absolute (ABS) and relative (REL) improvements of circuits A and B with respect to library 3. Each row corresponds to one simulation with one circuit and one library. Note that AWNS is the increase in WNS, and AN is the decrease in the number of violations.

TABLE 2A

| Circuit | Period (ps) | Library | WNS (ps) setup | WNS (ps) hold | Number of violations setup | Number of violations hold |
|---|---|---|---|---|---|---|
| Circuit A | 1500 | 3 | −1003 | −488 | 361 | 1868 |
|  |  | 1 | −790 | −488 | 285 | 1868 |
|  |  | 2 | −1003 | −307 | 361 | 1684 |
| Circuit B | 2500 | 3 | −766 | −26 | 1977 | 1 |
|  |  | 1 | −397 | −26 | 924 | 1 |
|  |  | 2 | −766 | 0 | 1977 | 0 |

TABLE 2B

| Circuit | Period (ps) | Library | ΔWNS (ps): abs (rel) setup | ΔWNS (ps): abs (rel) hold | ΔN: abs (rel) setup | ΔN: abs (rel) hold |
|---|---|---|---|---|---|---|
| Circuit A | 1500 | 3 | — | — | — | — |
|  |  | 1 | 213 (21.2%) | — | 76 (21.0%) | — |
|  |  | 2 | — | 181 (37.1%) | — | 184 (9.9%) |
| Circuit B | 2500 | 3 | — | — | — | — |
|  |  | 1 | 369 (48.2%) | — | 1053 (53.3%) | — |
|  |  | 2 | — | 26 (100.0%) | — | 1 (100.0%) |

WNS and the number of violations from library 3 are taken as a baseline, and the absolute and relative improvements are computed in WNS and the number of violations with respect to library 3 Improvements in WNS and the number of violations correspond, respectively, to an increase in WNS and a decrease in the number of violations. As listed in Tables 2A and 2B, the improvement in setup WNS is 369 ps (or 48.2%). This improvement corresponds to nearly 14% of the clock period. The improvement in hold WNS is 181 ps (or 37.1%). In terms of the number of violations, the improvement in the setup case is 53.3% and in the hold case is 9.9%. Note that for hold time improvements, the case where the only hold time violation is removed is ignored. These improvements can also be illustrated by means of slack histograms over all the endpoints rather than a single number like WNS. Histograms for the two circuits are shown in FIGS. 12(A), 12(B), 13(A), and 13(B). For both histograms, there is a shift towards the positive side, indicating improvements in almost all of the slack values. The baseline is the slacks from library 3. Note that the STA operation performed in the exemplary embodiment described above assumes a constant CLK-to-Q delay. Because the CLK-to-Q delay is treated as a constant, the STA process is performed as a series of local transformations (i.e., validations/violations are independently calculated for each synchronous circuit of the circuit design under test, and no excess slack is "carried forward" to a subsequent synchronous circuit). As such, the method avoids having to take into consideration any complexities that might be generated by variable CLK-to-Q delay times. As set forth above, the present invention provides an interdependent characterization methodology for setup and hold times of sequential cells. The interdependency removes optimism. The existence of multiple (setup time, hold time) pairs can be exploited to reduce unnecessary pessimism in STA. The characterization methodology and algorithm are validated using industrial circuits and tools, exhibiting significant improvement in the worst negative slack as well as the number of slack violations. Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, while the present invention is described herein with specific reference to flip-flop and latch-type sequential cells, other types of sequential cells may benefit from the methods and tools described herein as well. For example, the present invention provides a straight-forward improvement to transparent latch analysis. Also, the methods described herein may be used in conjunction with conventional STA approaches. For example, transparent latch analysis may be performed using conventional independent setup and hold library values, and then the interdependent setup/hold pair approach described above may be used to compute and analyze synchronous circuits that fail the independent analysis.

The invention claimed is:

1. A computer-implemented method of creating and using a library for a static timing analysis (STA) of a circuit design, the circuit design including a plurality of sequential cells, the method comprising:
   generating interdependent clock-to-output delay values for a plurality of setup/hold time pairs defined by at least one of said plurality of sequential cells;
   identifying a subset of the plurality of setup/hold time pairs that produce a selected clock-to-output delay value in said at least one of said plurality of sequential cells;
   utilizing the subset of setup/hold time pairs to generate the library; and
   utilizing the library to perform STA on the circuit design by analyzing each sequential cell to generate an associated setup skew and an associated hold skew, and comparing the associated setup skew and associated hold skew with a selected setup/hold time pair stored in the library.

2. The method according to claim 1, wherein generating interdependent clock-to-output delay values comprises generating delay values for independently selected setup time values and independently selected hold time values.

3. The method according to claim 2, wherein generating interdependent clock-to-output delay values further comprises varying the independently selected setup time values and independently selected hold time values such that the generated delay values simulate a delay surface having a stable delay region, a failure delay region, and a metastable region located between the stable and failure delay regions.

4. The method according to claim 3, wherein identifying the subset setup/hold time pairs comprises obtaining a contour curve of said delay surface.

5. The method according to claim 4, wherein utilizing the subset of setup/hold time pairs to generate the library comprises identifying one or more critical setup/hold time pairs that coincide with the contour curve.

6. The method according to claim 5, wherein utilizing the subset of setup/hold time pairs to generate the library further comprises generating a piecewise linear (PWL) approximation curve linking two or more of the critical setup/hold time pairs.

7. The method according to claim 6, wherein utilizing the subset of setup/hold time pairs to generate the library further comprises storing at least one of said two or more critical setup/hold time pairs and said PWL approximation curve in said library.

8. The method according to claim 1, wherein when said comparison between the associated setup skew and associated hold skew and the selected setup/hold time pair indicates a possible timing constraint violation, utilizing a piecewise linear (PWL) approximation curve to verify that the associated setup skew and associated hold skew actually violate a predetermined timing constraint.

9. The method according to claim 8, wherein when said associated setup skew and associated hold skew violate said predetermined timing constraint, quantifying an amount of the violation by comparing said associated setup skew and associated hold skew with a piecewise linear (PWL) approximation curve linking two or more of the setup/hold time pairs stored in the library.

10. The method according to claim 1, wherein the method further comprises:
    performing STA on the circuit design using independent setup and hold time values, and identifying a sequential cell that violates at least one of said independent setup and hold time values; and
    utilizing the library to perform STA on said identified sequential cell.

11. The method according to claim 1, wherein the sequential cell comprises a transparent latch.

12. A computer-implemented static timing analysis (STA) tool for analyzing a circuit design, the circuit design including a plurality of sequential cells, the STA tool comprising:
    means for calculating a setup skew and a hold skew for a selected sequential cell of the plurality of sequential cells; and
    means for comparing the calculated setup and hold skews with an interdependent setup/hold time pair stored in a library,
    wherein the interdependent setup/hold time pair includes a setup timing value and an associated hold timing value that are selected such that, when the sequential cell is subjected to the setup timing value and the associated hold timing value, the sequential cell exhibits a selected clock-to-output delay value.

13. The STA tool of claim 12, wherein said means for comparing further comprises means for determining when the selected setup/hold time pair indicates a possible timing constraint violation by the calculated setup and hold skews, and means for utilizing a piecewise linear (PWL) approximation curve to verify that the associated setup skew and associated hold skew actually violate a predetermined timing constraint.

14. The STA tool according to claim 13, further comprising means for quantifying a violation amount when said associated setup skew and associated hold skew violate said predetermined timing constraint.

15. The STA tool according to claim 12, further comprising means for performing STA on the circuit design using independent setup and hold skew values before comparing the calculated setup and hold skews with the interdependent setup/hold time pair.

* * * * *